United States Patent [19]
Jones et al.

[11] Patent Number: 5,960,186
[45] Date of Patent: Sep. 28, 1999

[54] DIGITAL CIRCUIT SIMULATION WITH DATA INTERFACE SCHEDULING

[75] Inventors: Clive Richard Jones; Michael John Williams, both of Cambridge, United Kingdom

[73] Assignee: Arm Limited, Cambridge, United Kingdom

[21] Appl. No.: 08/905,590

[22] Filed: Aug. 4, 1997

Related U.S. Application Data

[63] Continuation of application No. 08/537,153, Sep. 8, 1995, abandoned.

[30] Foreign Application Priority Data

Jun. 8, 1995 [GB] United Kingdom .................... 9511617

[51] Int. Cl.$^6$ ...................................................... G06F 15/16
[52] U.S. Cl. ................................. 395/500.25; 395/500.35
[58] Field of Search ..................................... 364/488–491, 364/578, 200; 395/500

[56] References Cited

U.S. PATENT DOCUMENTS

| | | | |
|---|---|---|---|
| 4,918,594 | 4/1990 | Onizuka ................................. | 364/200 |
| 5,313,615 | 5/1994 | Newman et al. ...................... | 395/500 |
| 5,416,842 | 5/1995 | Aziz ....................................... | 380/30 |
| 5,467,462 | 11/1995 | Fujii ....................................... | 364/578 |
| 5,477,474 | 12/1995 | Southgate et al. ..................... | 364/578 |
| 5,544,348 | 8/1996 | Umeda et al. ......................... | 395/500 |
| 5,663,900 | 9/1997 | Bhandara et al. ..................... | 364/578 |

FOREIGN PATENT DOCUMENTS

| | | | |
|---|---|---|---|
| 2 229 300 | 9/1990 | United Kingdom ............ | G06F 15/60 |
| 2 248 321 | 4/1992 | United Kingdom ............ | G06F 15/60 |

*Primary Examiner*—Eric W. Stamber
*Assistant Examiner*—Vuthe Siek
*Attorney, Agent, or Firm*—Fenwick & West LLP

[57] ABSTRACT

A digital circuit simulator for simulating data handling operations of a digital circuit includes a primary simulator operable in response to simulation instructions in a first programming language, and a plurality of simulation blocks for simulating data handling operations of respective sections of the digital circuit. Each simulation block is operable to receive external input data from the primary simulator, internal input data from another of the simulation blocks, or both. A data interface is arranged to exchange data with the primary simulator and the simulation blocks and is operable to supply external input data from the primary simulator to one or more simulation blocks, and to supply external output data from a simulation block to the primary simulator, and to supply internal output data from a simulation block to one or more other simulation blocks.

6 Claims, 4 Drawing Sheets

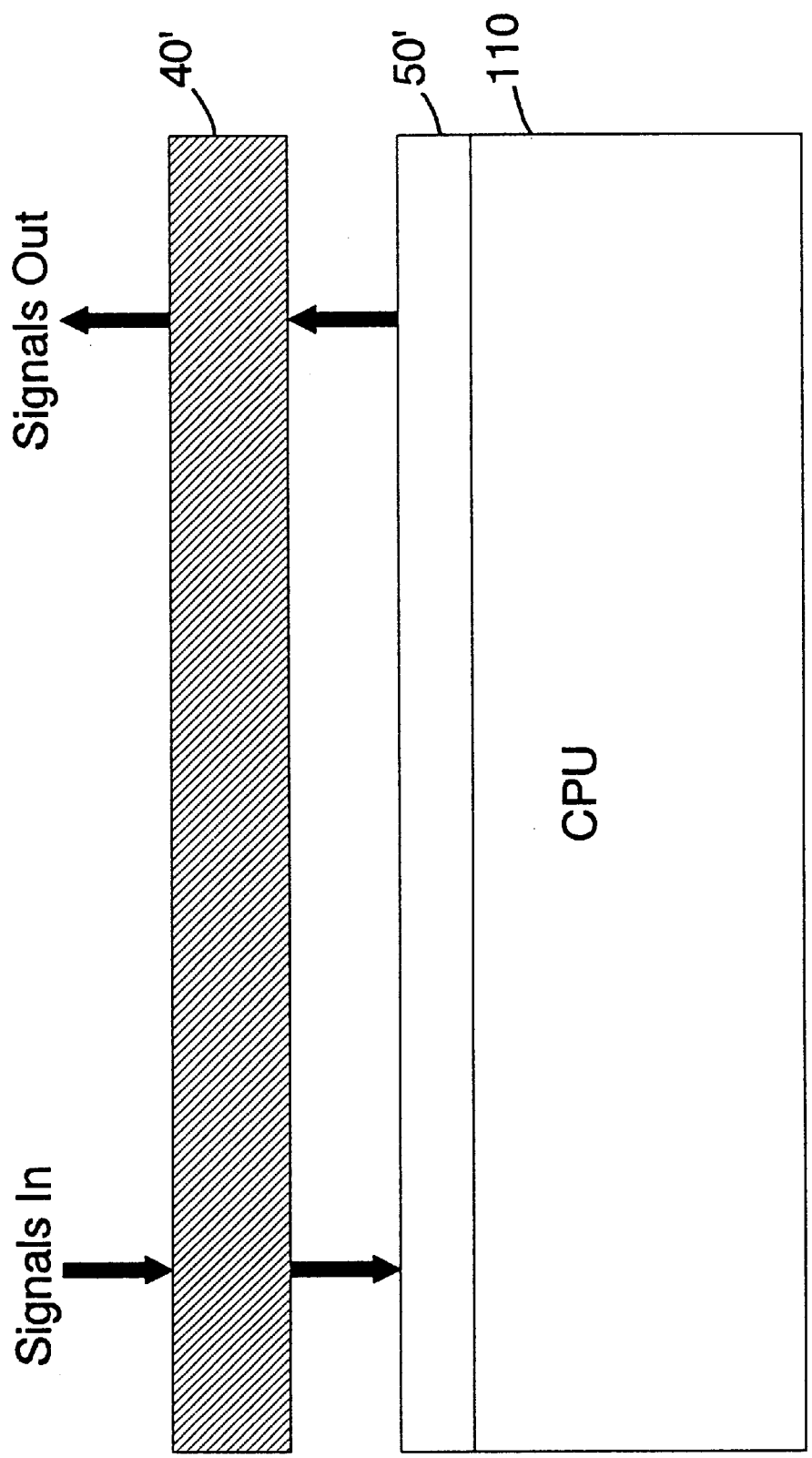

DIGITAL CIRCUIT SIMULATION WITH DATA INTERFACE SCHEDULING

This is a continuation of application Ser No. 08/537,153 filed on Sep. 8, 1995 now abandoned.

BACKGROUND OF THE DISCLOSURE

1. Field of the Invention

This invention relates to the simulation of digital circuits such as, for example, digital integrated circuits.

2. Description of the Prior Art

Digital circuit simulation involves simulating the functions of a digital circuit in software running on a general purpose computer. The technique is particularly useful when applied to complex digital integrated circuits such as microprocessors, for two main reasons. One reason is that the simulation allows the microprocessor designers to test the design before starting the relatively expensive semiconductor fabrication process for the circuit. Another reason is that the simulation can be used during the development of hardware and software peripherals intended to work with the microprocessor, so that the peripherals can be made available as soon as possible after fabrication of the microprocessor.

Several digital circuit simulation computer programs are commercially available. Four examples are "Vantage Spreadsheet", "Synopsys Vss", "Cadence Verilog" and "Modeltech V-System".

These four digital circuit simulation packages use dedicated logic simulation programming languages or an open standard language such as "VHDL", but they also allow blocks of simulation code written in, for example, the C programming language, to be interfaced to the main simulation written in the language of the main or primary simulator. This facility is referred to by various names as listed below, and is described in the following publications, which are hereby incorporated into this application by reference:

| Vantage Spreadsheet: | "STYX" | Vantage Spreadsheet Styx Reference Manual, v5.0, 1993 |
| --- | --- | --- |
| Synopsys Vss: | "C language interface" ("CLI") | VSS Expert Interfaces Manual, 1994 |
| Cadence Verilog; | "Programming language interface" ("PLI") | Cadence Programming Language Interface Reference Manual, vols 1 and 2, v1.6a, 1992 |
| Modeltech V-System: | "Foreign language interface" | V-System Manual, v4.3, January 1995 |

With each of the packages described above, blocks of C code can be written to simulate relatively small blocks of the microprocessor such a pipeline unit, a program counter, or even an arithmetic logic unit. Each block is then interfaced directly to the simulation package to provide a simulation of the entire microprocessor.

An example of this arrangement is shown in FIG. 1 of the accompanying drawings, which is a schematic diagram showing the interaction of several of such simulation blocks 10, 20, 30 with a primary simulator 40 in a previously-proposed digital circuit simulator. The primary simulator could be, for example, one of the four commercially available simulators described above.

Each of the simulation blocks 10, 20, 30 is written in the C programming language and simulates the operation of a respective part of a microprocessor. For example, a simulation block could simulate a multiplier unit, a status register, an instruction pipeline and so on.

In general, each simulation block will require and will generate two classes of input and output data. One of these classes, which will be referred to as "internal" data, is data representing internal signals passed between different component parts of the digital circuit. In the case of simulation of a microprocessor, examples of such signals are internal register values or zero flags. In this case, when the integrated circuit is fabricated as a semiconductor product, internal signals such as these would not be routed to input/output pins or connections of the integrated circuit; they would simply be passed between internal components.

The other class of data is referred to as "external" data, and this represents electrical signals which are normally passed to and from the outside world when the circuit is fabricated as a semiconductor product. Examples of external signals are a clock signal and an external address bus.

However, because in FIG. 1 the simulation blocks are connected to one another only via the primary simulator 40, both internal and external signals must be passed to and from the primary simulator 40. As described above, this means that details of the internal operation of the integrated circuit, in particular details of the internal signal traffic and the identity and function of the simulation blocks, which would otherwise be kept confidential, have to be disclosed to users of the simulator.

FIG. 1 illustrates a further feature of previously proposed simulators, which is the use of "veneers" to tailor the interface between the simulation blocks 10, 20, 30 and the particular primary simulator 40 in use. The veneers 50, 60, 70 allow the simulation blocks 10, 20, 30 and so on to be prepared in a generic way, so that only a relatively small amount of work is required to add the veneers for communication with a particular primary simulator 40.

FIG. 2 of the accompanying drawings is a schematic circuit diagram corresponding to the arrangement of FIG. 1. FIG. 2 illustrates a number of examples of simulation blocks (e.g. condition unit, multiplier, arithmetic logic unit (ALU), pipeline), interconnected via the primary simulator 40. Accordingly, although these blocks would communicate directly in a fabricated integrated circuit, in the simulator arrangement the blocks have to communicate via the primary simulator 40.

This previously proposed arrangement has two main disadvantages. One is that each code block must be made compatible with the correct simulation package, either by writing the code in a particular way or by applying the correct veneer for each code block. Another possibly more significant disadvantage stems from the fact that the simulation code is often distributed by the microprocessor designers to third party companies before the microprocessor is placed on the market. Because the individual code blocks represent relatively small parts of the microprocessor and have to be accompanied by information specifying the internal signals exchanged between the blocks, the microprocessor designer is actually distributing far more detailed information about the internal operation of the microprocessor than is actually required by a peripheral designer. In fact, in many cases much of the information which has to be distributed in this way would otherwise be kept confidential by the microprocessor designer even after the fabricated product is placed on the market. While this information is generally not abused by the recipient, the fact that the detailed design information is supplied to third party peripheral designers does expose the microprocessor designer to possible breaches of confidence by unauthorised copying or distribution of the design information.

SUMMARY OF THE INVENTION

It is an object of the invention to provide a digital circuit simulator allowing improved security for internal design details of a circuit to be simulated.

This invention provides a digital circuit simulator (e.g. simulation apparatus) for simulating data handling operations of a digital circuit, the simulator comprising:

a primary simulator operable in response to simulation instructions in a first programming language, a plurality of simulation blocks for simulating data handling operations of respective sections of the digital circuit, each simulation block being operable to receive external input data from the primary simulator, internal input data from another of the simulation blocks, or both, and each simulation block being operable to generate external output data for output to the primary simulator, internal output data for output to one or more other simulation blocks, or both; and a data interface arranged to exchange data with the primary simulator and the simulation blocks, the data interface being operable:

(i) to supply external input data from the primary simulator to one or more simulation blocks;

(ii) to supply external output data from a simulation block to the primary simulator; and (iii) to supply internal output data from a simulation block to one or more other simulation blocks.

The invention addresses the problems described above by providing an intermediate data interface between the simulation blocks and the primary (e.g. proprietary) simulator. The data interface routes "external" data signals to and from the primary simulator, but routes "internal" data signals (which in turn may simulate non-published internal electrical signals of the digital circuit) only to other simulation blocks and not to the primary simulator.

In this way, a complete simulation of the digital circuit can be built up in blocks, as before, but when the simulation is supplied to third party developers there is no need to disclose the operation of the digital circuit other than the external data signals required for the development of peripherals. In this way, the exposure to abuse of information relating to the internal operation of the digital circuit is greatly reduced.

The invention also provides a single interface between all of the simulation blocks and the primary simulator, so that only that one interface needs to be tailored (e.g. veneered) to operate with the primary simulator. This also means that the interface between the simulation blocks and the data interface is not constrained by the published interface protocol with the primary simulator, and so can be made more efficient (e.g. faster) than would be possible in the previous system of FIG. 1.

Preferably the digital circuit is in fact a digital integrated circuit.

Although the invention is applicable to simulation of various types of integrated circuit, the invention is particularly applicable to the simulation of a microprocessor (which term as used here encompasses any programmable processing device). In this case, it is preferred that the external input data comprises:

(i) data representing processing instructions of the microprocessor; and (ii) data representing operands to be processed by the microprocessor.

Preferably the external input data comprises data representing a clock signal.

Preferably, the operation of the simulation blocks is controlled by simulation instructions in a second programming language (e.g. C), different to the first programming language. Preferably, to help preserve the confidentiality of the simulation block function as described above, this second language may be compiled into a form which is not readily readable by a human (this is the case with languages such as C).

Because some of the external output data generated by a simulation block (e.g. a main data or address bus) may be useful by other simulation blocks, it is preferred that the data interface is operable to supply external output data from a simulation block to one or more other simulation blocks.

The data interface may also be used to mask confidential scheduling information relating to time-delayed operations of the simulation blocks from the primary simulator. In order to achieve this, it is preferred that the data interface comprises: means for receiving and storing schedule data from a simulation block, the schedule information specifying an operation to be performed by a simulation block and a time at which the operation is to be performed; means for requesting a scheduling call from the primary simulator at the time at which the operation is to be performed; and means responsive to the scheduling call received from the primary simulator for initiating the operation.

This invention also provides a digital circuit simulator for simulating data handling operations of a digital circuit, the simulator being operable to exchange data with a primary simulator operable in response to simulation instructions in a first programming language, the simulator comprising: a plurality of simulation blocks for simulating data handling operations of respective sections of the digital circuit, each simulation block being operable to receive external input data from the primary simulator, internal input data from another of the simulation blocks, or both, and each simulation block being operable to generate external output data for output to the primary simulator, internal output data for output to one or more other simulation blocks, or both; and a data interface arranged to exchange data with the primary simulator and the simulation blocks, the data interface being operable:

(i) to supply external input data from the primary simulator to one or more simulation blocks;

(ii) to supply external output data from a simulation block to the primary simulator; and (iii) to supply internal output data from a simulation block to one or more other simulation blocks.

BRIEF DESCRIPTION OF THE DRAWINGS

The above and other objects, features and advantages of the invention will be apparent from the following detailed description of illustrative embodiments which is to be read in connection with the accompanying drawings, in which:

FIG. 4 is a schematic circuit diagram corresponding to the arrangement of FIG. 3.

DESCRIPTION OF THE PREFERRED EMBODIMENTS

Figure 3:
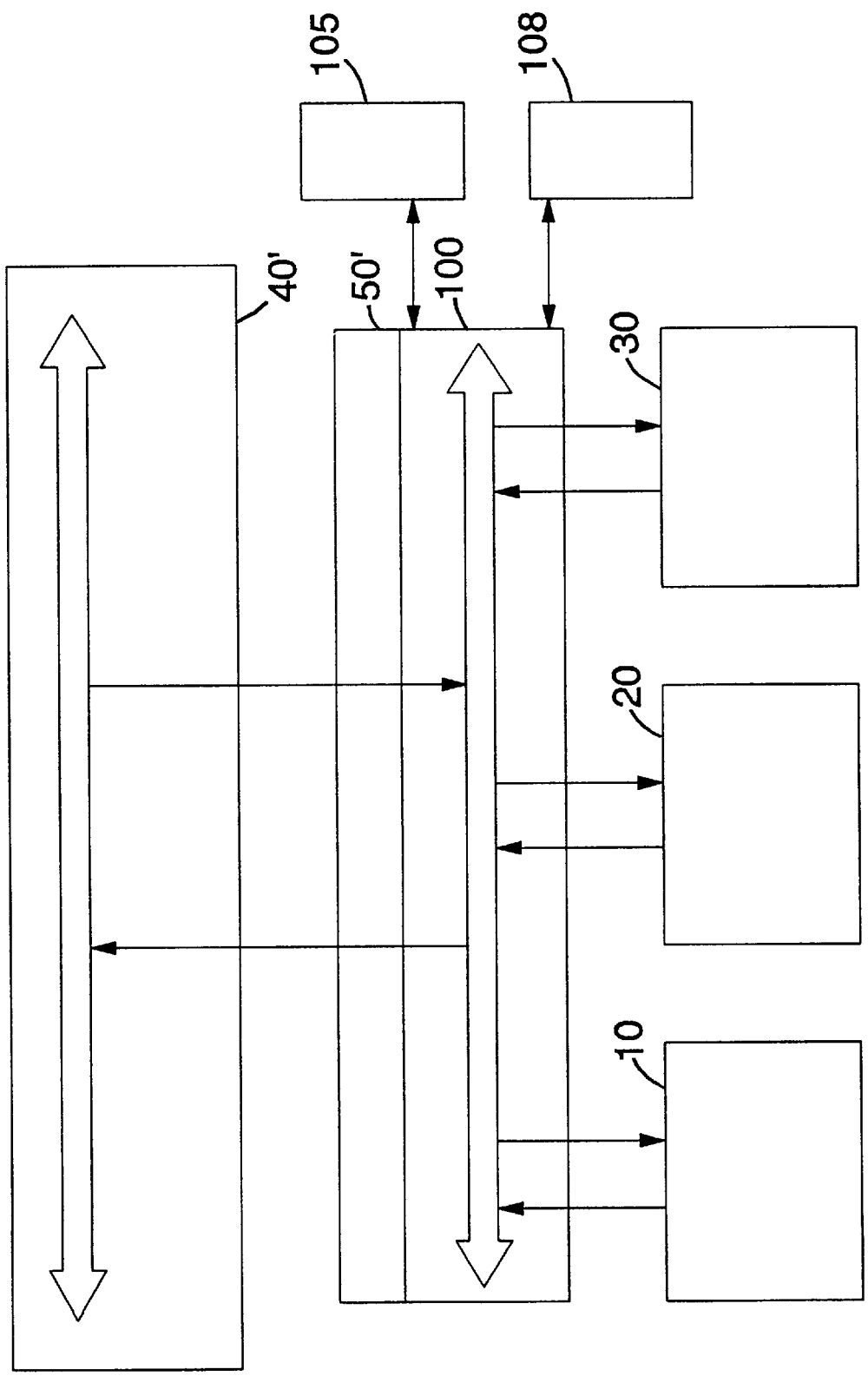
FIG. 3 is a schematic diagram showing the interaction of simulation blocks in an integrated circuit simulator according to an embodiment of the present invention.

FIG. 3 is a schematic diagram showing the interaction of simulation blocks in an integrated circuit simulator according to an embodiment of the present invention.

The simulation blocks 10, 20, 30 are similar to those described above. However, they communicate with a data interface block 100 rather than with the primary simulator (in this case, 40').

The data interface block 100 stores a list 105 of the data signals to be routed to and from the simulation blocks and the primary simulator. The list indicates the required destination of a received signal and also whether the signal is an internal or an external data signal (this information may in fact be implied in the destination information).

The operation of the data interface block 100 is straightforward, in that when it receives a data signal from a simulation block or the primary simulator 40', it routes that data signal according to the routing information in the stored list. (In a second embodiment this routing may involve the use of timing information; however, for ease of description, the use of such timing information will be described separately below).

In more detail, the following is a list of examples of simulation blocks, giving the data inputs and data outputs used by each block. In the table, external data signals are underlined; non-underlined signals are internal signals.

| Block | Inputs | Outputs |
| --- | --- | --- |
| Shifter | clock, shift control, current instruction, B bus | shifted operand, shift carry |
| Data in bus | clock, databus, data in control | B bus |
| Data out bus | clock, B bus, data out control | databus |
| Address register | clock, ALU result, PC, address register control | addressbus |
| Multiplier | clock, multiply control, A bus, B bus | A bus, B bus, multiplier zero flag |
| Arithmetic logic unit (ALU) | clock, A bus, shifted operand, carry in, current instruction, ALU control | ALU result, ALU status flags |
| Condition unit | clock, status flags, current instruction | not-execute flag |
| Instruction decoder | clock, current instruction | miscellaneous controls to other blocks |
| Register bank | clock, ALU result, register bank controls | A bus, B bus, PC |
| Program counter (PC) | clock, ALU result, PC controls | A bus, B bus, PC |
| Status register | clock, status register controls, shift carry, ALU status flags, multiplier zero flag | status flags |
| Pipeline | clock, databus, pipeline controls | current instruction |

For example, a clock signal received as an external input signal from the primary simulator 40' is routed to all of the simulation blocks in accordance with the above table. In contrast, a program counter value is generated as an internal output signal by a program counter simulation block and is routed via the data interface block 100 directly to an address register interface block, i.e. not to the primary simulator 40'.

The result is that only external signals, which would normally be supplied as inputs or outputs of a fabricated semiconductor integrated circuit are exchanged with the primary simulator 40'.

A further feature is that only one veneer 50' is required, to control the interface between the data interface block 100 and the primary simulator 40'. It is no longer necessary to apply a veneer to each of the simulator blocks 10, 20, 30.

Figure 1:
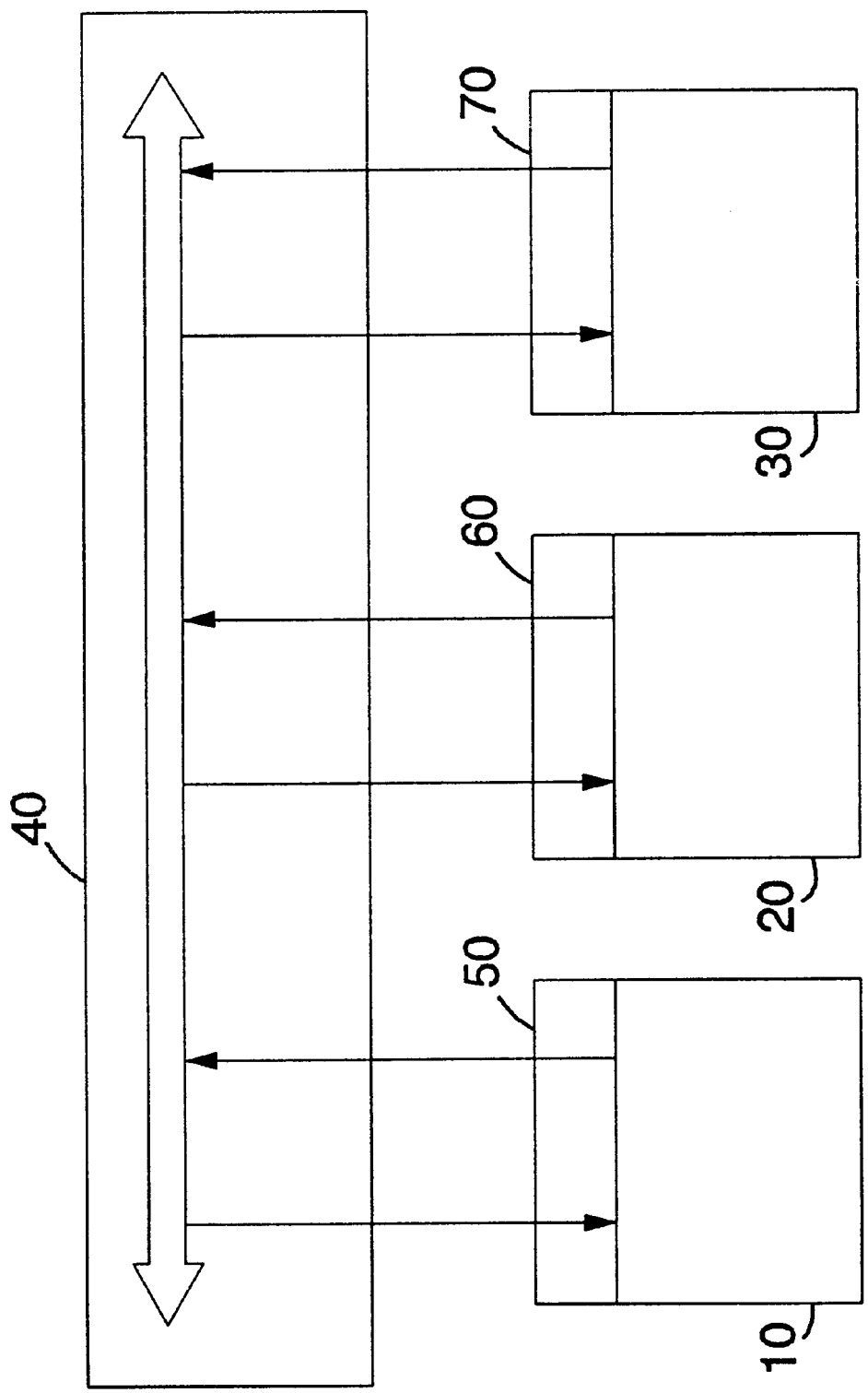
FIG. 1 is a schematic diagram showing the interaction of simulation blocks in a previously proposed digital circuit simulator.
Figure 2:
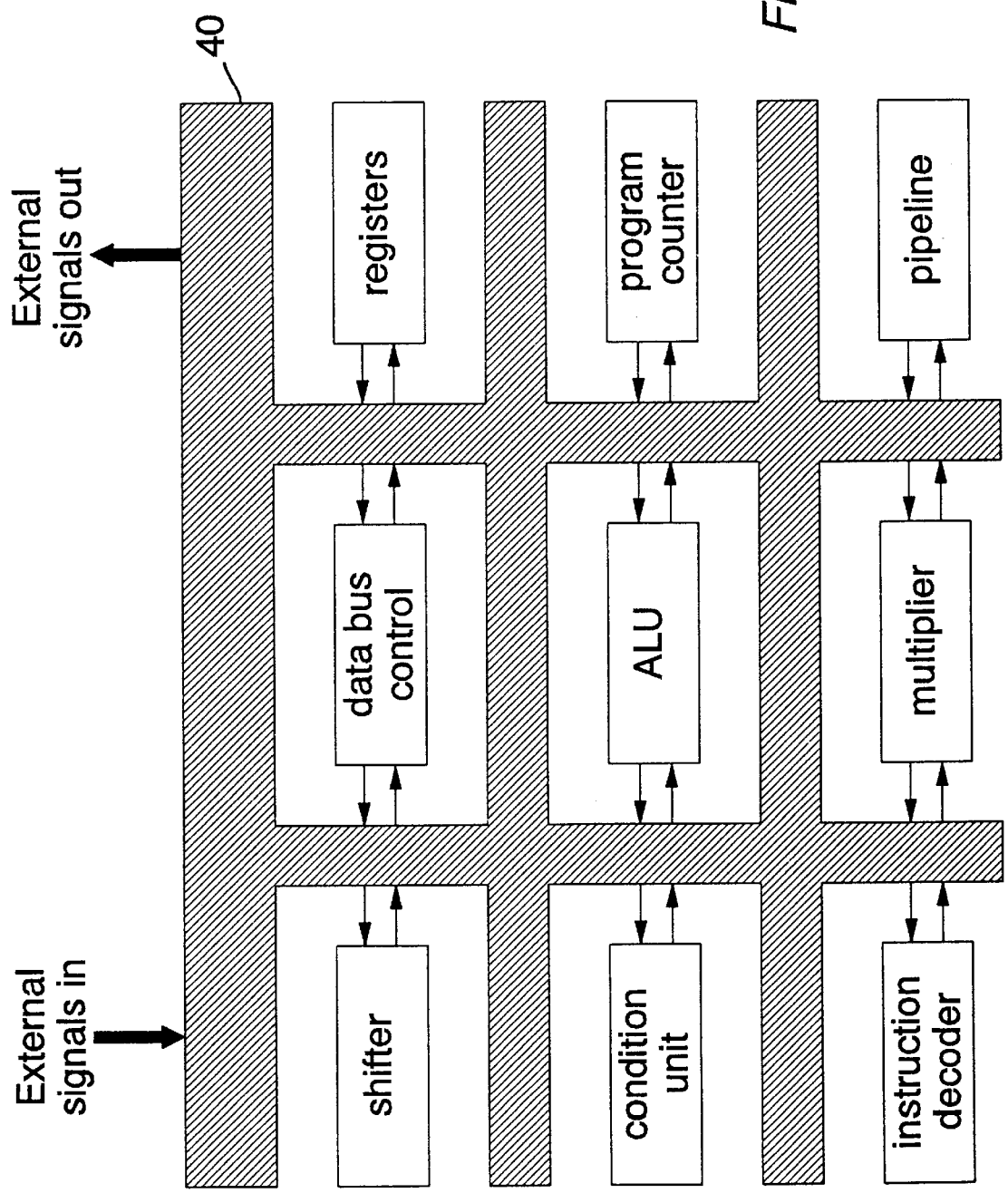
FIG. 2 is a schematic circuit diagram corresponding to the arrangement of FIG. 1.

The arrangement is illustrated schematically in FIG. 4, where in contrast to FIG. 2, the primary simulator 40' communicates with the simulated microprocessor 110 as a whole via the veneer 50'. Internal signals associated with internal operation of the microprocessor 110 do not need to be supplied to or from the primary simulator 40'.

In a second embodiment, timing information is included in the simulation to simulate events which take a finite time to complete. For example, a simulation block for simulating, say, a register block may be capable of providing an output value instantaneously with respect to simulation time, whereas the value would take a finite (real) time to compute in a real fabricated circuit. Accordingly, in order to simulate the operation of such a block, the simulation could receive a request for the contents of one of the registers at a certain time and instruct the block to generate the output data, but then not read the output data until an appropriate delay period (with respect to simulation time) after the request.

Previously, such events were scheduled for future execution by passing details to a scheduler forming part of the primary simulator. However, this would force details of the actions to be provided to the user of the primary simulator.

To avoid this problem, in a second embodiment of the present system this is accomplished by the data interface 100 maintaining a list 108 or "heap" (which need not necessarily be ordered) of events (such as the register access described above) which are scheduled to be performed in the future. Details of these events are supplied from the simulation blocks to the data interface.

When the data interface receives details of each such event from a simulation block, the data interface stores details of the specific actions to be taken, along with the time at which the action should be taken. However, the data interface passes only details of the time of execution to the scheduler in the primary simulator.

The primary simulator receives the time information from the data interface and schedules non-specific events to be initiated at those times. When each of the times is reached, the primary simulator sends a non-specific scheduling signal to the data interface. This causes the data interface to consult the heap of queued events, and to initiate the event (or events) such as the reading of an output value from a register simulation block arranged to take place at that time.

In this way, the only details of the queued events which must be supplied to the primary simulator are the times of execution; other details are handled by the data interface.

Although illustrative embodiments of the invention have been described in detail herein with reference to the accompanying drawings, it is to be understood that the invention is not limited to those precise embodiments, and that various changes and modifications can be effected therein by one skilled in the art without departing from the scope and spirit of the invention as defined by the appended claims.

We claim:

1. A digital circuit simulator for simulating data handling operations of a digital circuit, said simulator comprising:
   a primary simulator operable in response to simulation instructions in a first programming language;
   a secondary simulator arranged to exchange data with said primary simulator and a plurality of simulation blocks, said secondary simulator being operable:
   (i) to supply external input data from said primary simulator to one or more of said simulation blocks for simulating data handling operations of respective sections of said digital circuit, each of said plurality of simulation blocks being operable to receive external input data from said primary simulator via said secondary simulator, internal input data from another of said simulation blocks, or both, and each said simulation block being operable to generate external output data for output to said primary simulator via said secondary simulator, internal output data for output to one or more other said simulation blocks, or both;

(ii) to supply external output data from one or more of said plurality of simulation blocks to said primary simulator; and (iii) to supply internal output data from one or more of said plurality of simulation blocks to one or more other said simulation blocks and said secondary simulator including means for receiving and storing schedule data from a simulation block, said schedule data specifying an operation to be performed by a simulation block and a simulation time at which said operation is to be performed in accordance with the schedule data;

said secondary simulator further comprising means for requesting a scheduling call, corresponding to said schedule data, from said primary simulator at the simulation time at which the operation is to be performed, wherein the scheduling call does not specify said operation; and said secondary simulator further comprising means responsive to said scheduling call received from said primary simulator for initiating said operation in accordance with said schedule data.

2. A simulator according to claim 1, in which said digital circuit is a microprocessor and said external input data comprises:

(i) data representing processing instructions of said microprocessor; and (ii) data representing operands to be processed by said microprocessor.

3. A simulator according to claim 1, in which said external input data comprises data representing a clock signal.

4. A simulator according to claim 1, in which operation of said simulation blocks is controlled by simulation instructions in a second programming language, different to said first programming language.

5. A simulator according to claim 1, in which said secondary simulator is operable to supply external output data from a simulation block to one or more other said simulation blocks.

6. A digital circuit simulator for simulating data handling operations of a digital circuit, said simulator being operable to exchange data with a primary simulator operable in response to simulation instructions in a first programming language, said simulator comprising:

a secondary simulator arranged to exchange data with said primary simulator and a plurality of simulation blocks, said secondary simulator being operable:

(i) to supply external input data from said primary simulator to one or more of said simulation blocks for simulating data handling operations of respective sections of said digital circuit, each of said plurality of simulation blocks being operable to receive external input data from said primary simulator via said secondary simulator, internal input data from another of said simulation blocks, or both, and each simulation block being operable to generate external output data for output to said primary simulator via said secondary simulator, internal output data for output to one or more other simulation blocks, or both; and (ii) to supply external output data from one or more of said plurality of simulation blocks to said primary simulator; and (iii) to supply internal output data from one or more of said plurality of simulation blocks to one or more other simulation block and said secondary simulator including means for receiving and storing schedule data from a simulation block, said schedule data specifying an operation to be performed by a simulation block and a simulation time at which said operation is to be performed in accordance with the schedule data;

said secondary simulator further comprising means for requesting a scheduling call, corresponding to said schedule data, from said primary simulator at the simulation time at which the operation is to be performed, wherein the scheduling call does not specify said operation; and said secondary simulator further comprising means responsive to said scheduling call received from said primary simulator for initiating said operation in accordance with said schedule data.

* * * * *